(12) United States Patent
Schuppe

(10) Patent No.: US 7,131,099 B2
(45) Date of Patent: Oct. 31, 2006

(54) METHOD, APPARATUS, AND COMPUTER PROGRAM PRODUCT FOR RTL POWER SEQUENCING SIMULATION OF VOLTAGE ISLANDS

(75) Inventor: Raymond Walter Manfred Schuppe, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 11/008,808

(22) Filed: Dec. 9, 2004

(65) Prior Publication Data

US 2006/0129954 A1 Jun. 15, 2006

(51) Int. Cl.
*G06F 17/50* (2006.01)
(52) U.S. Cl. .......................................... 716/18; 703/13
(58) Field of Classification Search ................ 716/2, 716/4, 18; 703/13–14
See application file for complete search history.

(56) References Cited

U.S. PATENT DOCUMENTS

| | | | |
|---|---|---|---|
| 6,363,515 B1 * | 3/2002 | Rajgopal et al. ............... | 716/5 |
| 6,735,744 B1 * | 5/2004 | Raghunathan et al. ......... | 716/4 |
| 6,779,163 B1 * | 8/2004 | Bednar et al. .................. | 716/7 |
| 6,820,240 B1 * | 11/2004 | Bednar et al. .................. | 716/1 |
| 6,883,152 B1 * | 4/2005 | Bednar et al. .................. | 716/5 |
| 2004/0019859 A1 * | 1/2004 | Ravi et al. ...................... | 716/4 |
| 2004/0060024 A1 * | 3/2004 | Bednar et al. .................. | 716/7 |
| 2004/0236559 A1 * | 11/2004 | Chen ........................... | 703/18 |
| 2004/0243958 A1 * | 12/2004 | Bednar et al. .................. | 716/7 |
| 2004/0268278 A1 * | 12/2004 | Hoberman et al. ............. | 716/5 |

FOREIGN PATENT DOCUMENTS

EP 863470 A1 * 9/1998

* cited by examiner

Primary Examiner—Stacy A. Whitmore
(74) Attorney, Agent, or Firm—Joan Pennington

(57) ABSTRACT

A method, apparatus and computer program product are provided for implementing RTL power sequencing simulation of voltage islands for application specific integrated circuit (ASIC) designs. RTL sequential state saving elements in a voltage island hierarchy are identified. A state is invalidated for each identified RTL sequential state saving element during a power down operation. Switch objects are used to identify and skip globally powered gate level circuits in the voltage island. RTL sequential state saving elements and VI switch objects can be identified using predefined reserved signal identifiers in the ASIC library.

16 Claims, 8 Drawing Sheets

PRIOR ART

EXEMPLARY PATH THROUGH VI SWITCH OBJECTS

PRIOR ART

EXEMPLARY PATH THROUGH VI SWITCH OBJECTS

METHOD, APPARATUS, AND COMPUTER PROGRAM PRODUCT FOR RTL POWER SEQUENCING SIMULATION OF VOLTAGE ISLANDS

FIELD OF THE INVENTION

The present invention relates generally to the electronic design automation field, and more particularly, relates to a method, apparatus and computer program product for implementing register transfer level (RTL) power sequencing simulation of voltage islands.

DESCRIPTION OF THE RELATED ART

A voltage island in an application specific integrated circuit (ASIC) design includes a circuitry that can be put into a power down state. During a power down state, circuits in a voltage island will no longer have valid logic values.

Computer simulation of digital hardware systems has become a common technique used for the verification of hardware systems, advantageously reducing cost and time required. Hardware description language (HDL) simulators are used for verification of an application specific integrated circuit (ASIC) or a custom integrated circuit (IC).

Known register transfer level (RTL) design tools for designing integrated circuits (IC's) do not enable power sequencing simulation of voltage islands. Correct simulation of a voltage island is a challenging problem. In the realm of RTL digital simulation, power supply signals are not present in the simulation models or simulation netlist. With RTL design tools, an ASIC design is represented in a high level logic language such as a high level hardware description language (VHDL) or Verilog.

Currently available Verilog and VHDL model libraries in themselves do not contain logic to model power down behavior. Further adding such logic to the simulation models and the associated wiring in high level netlists is not practical, nor is it desirable.

For the current IBM voltage island methodology, the output ports of library cells in a voltage island are forced to drive an undefined value, a value of 'X' in terms of digital simulation, during power down. This is done by defining a voltage island as a particular hierarchical instance or sub network definition (module(Verilog) or entity(VHDL) boundary) in the simulation netlist. The power to the voltage island is then controlled by a voltage island switch object that is controlled by the simulation. The voltage island switch object uses a simulator API to navigate this hierarchy. The simulator API can find these low level cells in the voltage island hierarchy and forces the outputs of these cells to an invalid state. During subsequent power on operations these logic forces are released.

FIG. 1A illustrates how such switch objects would place Xs on discrete circuit elements, as labeled X. The switch objects will follow some path through the VI hierarchy in the low wire/gate level representation. The current IBM voltage island methodology works perfectly well in a netlist where the voltage island hierarchy consists entirely of wires with 1000's of individual instances of small discrete circuit elements that are very small sub-hierarchies connected together to form the logic.

However, the problem is that a netlist is normally not available when the logic is being developed. Logic is developed at a higher level of abstraction called RTL (Register Transfer Level). At this level the logic has not yet undergone the transformation that breaks it down into individual discrete circuit elements with the multitude of interconnecting wires. This transformation is called logic synthesis and is normally done by fast workstations and is still very time consuming. For example, the logic synthesis of a typical chip can take 1–5 days depending on the complexity and size of the design. The current voltage island switch objects will not and can not accurately simulate design logic written in RTL.

VI switch objects will bypass the RTL as shown in FIG. 1B. Currently the VI switch objects only traverse the hierarchy to find the bottom most modules or the library cells-discrete circuit elements and forces X's on those nodes, as illustrated in FIG. 1A This means that when an engineer designs power control logic for a voltage island they must involve the logic synthesis team and wait for days before they can actually accurately simulate/test their design.

Because RTL power sequencing simulation of voltage islands is not available, design teams may be forced suspend running the power sequencing simulations to very late stages of the design, due to the lack of available synthesis resources. Without early testing of the power control logic the design team may not be able to correct problems in the logic and require a second design pass for an ASIC design.

There is no other known solution, unless the designer were to design the entire voltage island logic in discrete gate level components. That of course is entirely unacceptable with complex large designs.

A need exists for an effective mechanism for implementing RTL power sequencing simulation of voltage islands.

SUMMARY OF THE INVENTION

Principal aspects of the present invention are to provide a method, apparatus and computer program product for implementing RTL power sequencing simulation of voltage islands. Other important aspects of the present invention are to provide such method, apparatus and computer program product for implementing RTL power sequencing simulation of voltage islands substantially without negative effect and that overcome many of the disadvantages of prior art arrangements.

In brief, a method, apparatus and computer program product are provided for implementing RTL power sequencing simulation of voltage islands for application specific integrated circuit (ASIC) designs. RTL sequential state saving elements in a voltage island hierarchy are identified. A state is invalidated for each identified RTL sequential state saving element during a power down operation. Switch objects are used to identify and skip globally powered gate level circuits in the voltage island.

In accordance with features of the invention, sequential RTL state saving elements and VI switch objects are identified using predefined reserved signal identifiers in the ASIC library. Using RTL (register transfer level) design levels, an ASIC design is represented in a high level logic language such as VHSIC Hardware Description Language (VHDL) or Verilog. For Verilog HDL designs, RTL sequential state saving elements are identified by register and memory declarations in the source RTL design. The RTL sequential state saving elements are detected and forced to invalid states by using a Verilog PLI. For VHDL designs, RTL sequential state saving elements are identified by signals that are driven by complex or named processes. For VHDL these signals are forced to an undefined state and a driver for these signals are invalidated.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a logic designer is enabled to effectively simulate and test logic written in RTL without having to take the logic through synthesis to a netlist. The logic designer no longer needs to wait for days before they can verify their logic is correct, they can test it immediately and determine if there is a problem in minutes. During early development even the simplest pieces of electronic logic typically require several attempts or iterations before something functional takes shape. By reducing each iteration by days this invention can end up saving two to eight weeks of time in implementing the logic associated with power sequencing of a voltage island. RTL power sequencing simulation can help ensure first time right success for our customers.

Figure 1A:
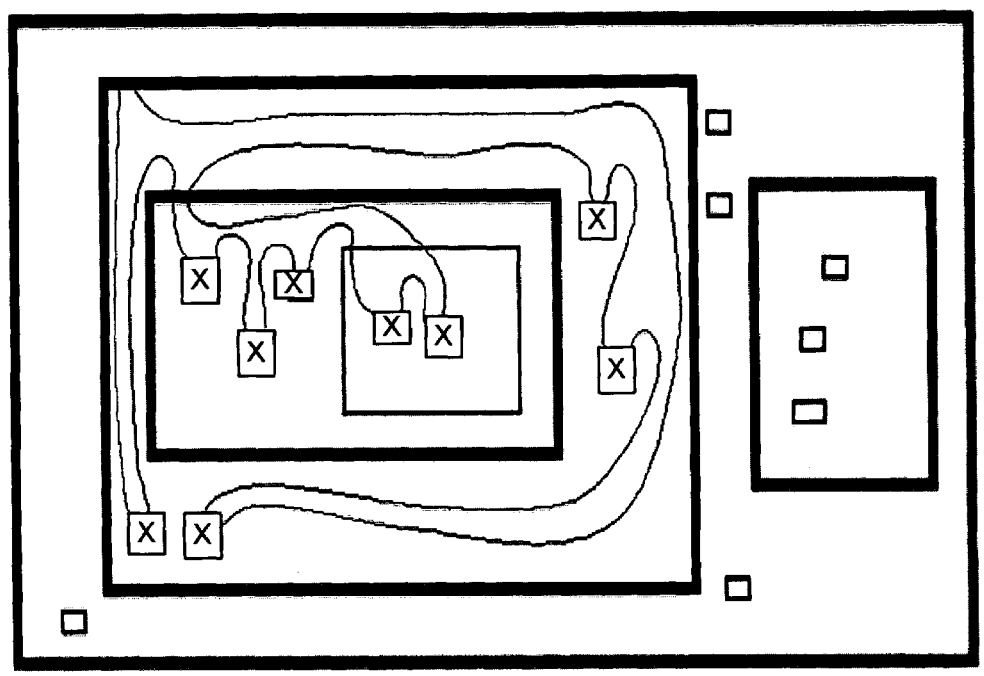
FIGS. 1A and 1B respectively illustrate a conventional voltage island (VI) switch objects at a low level and that the conventional voltage island (VI) switch objects bypass RTL design logic.
Figure 1B:
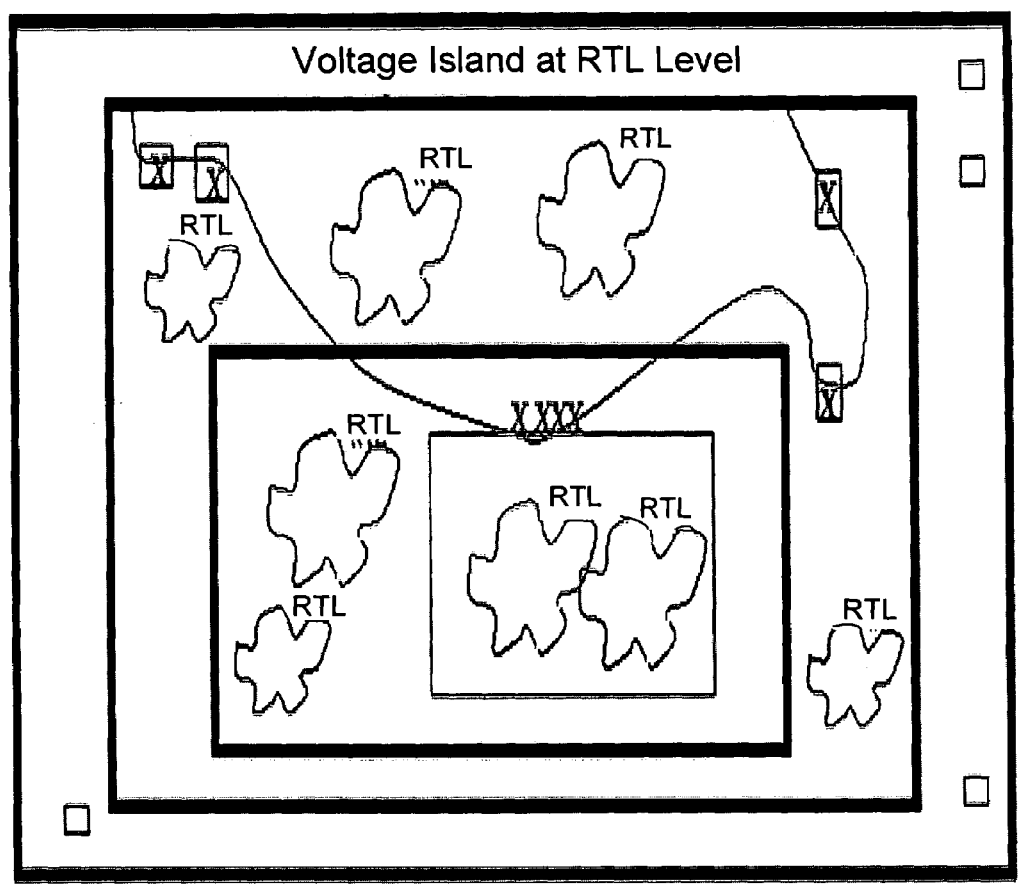
Figure 2A:
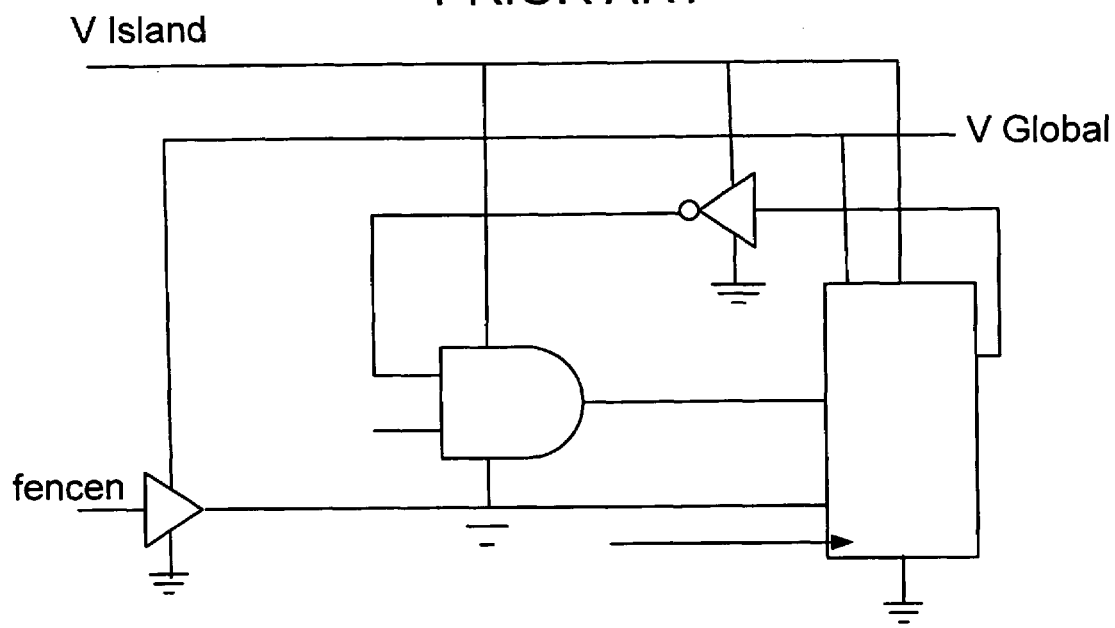
FIGS. 2A and 2B respectively illustrate a voltage island logic representation and a conventional logic representation in accordance with the preferred embodiment.
Figure 2B:
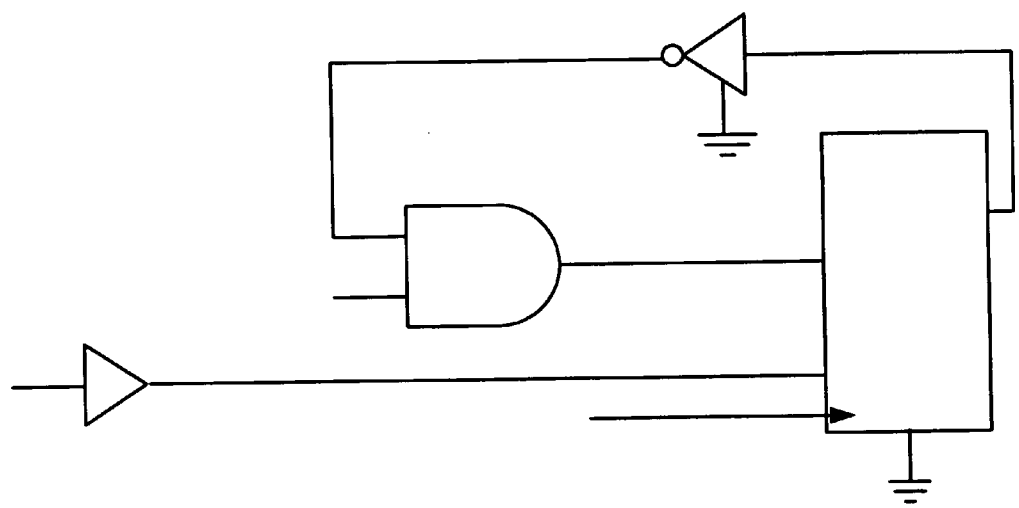

FIGS. 2A and 2B respectively illustrate a voltage island logic representation and a conventional logic representation generally designated by the reference character 200 implemented in accordance with a method of the preferred embodiment.

In accordance with features of the invention, an enhanced VI switch object is provided for implementing RTL power sequencing simulation of voltage islands. Conventional IBM voltage island (VI) switch objects currently only work for gate level netlists of voltage island circuits. The enhancement to the switch objects uses the simulator API to identify sequential RTL elements or RTL state saving elements in the voltage island's hierarchy and takes actions to invalidate the state of those elements during a power down operation.

Figure 3:
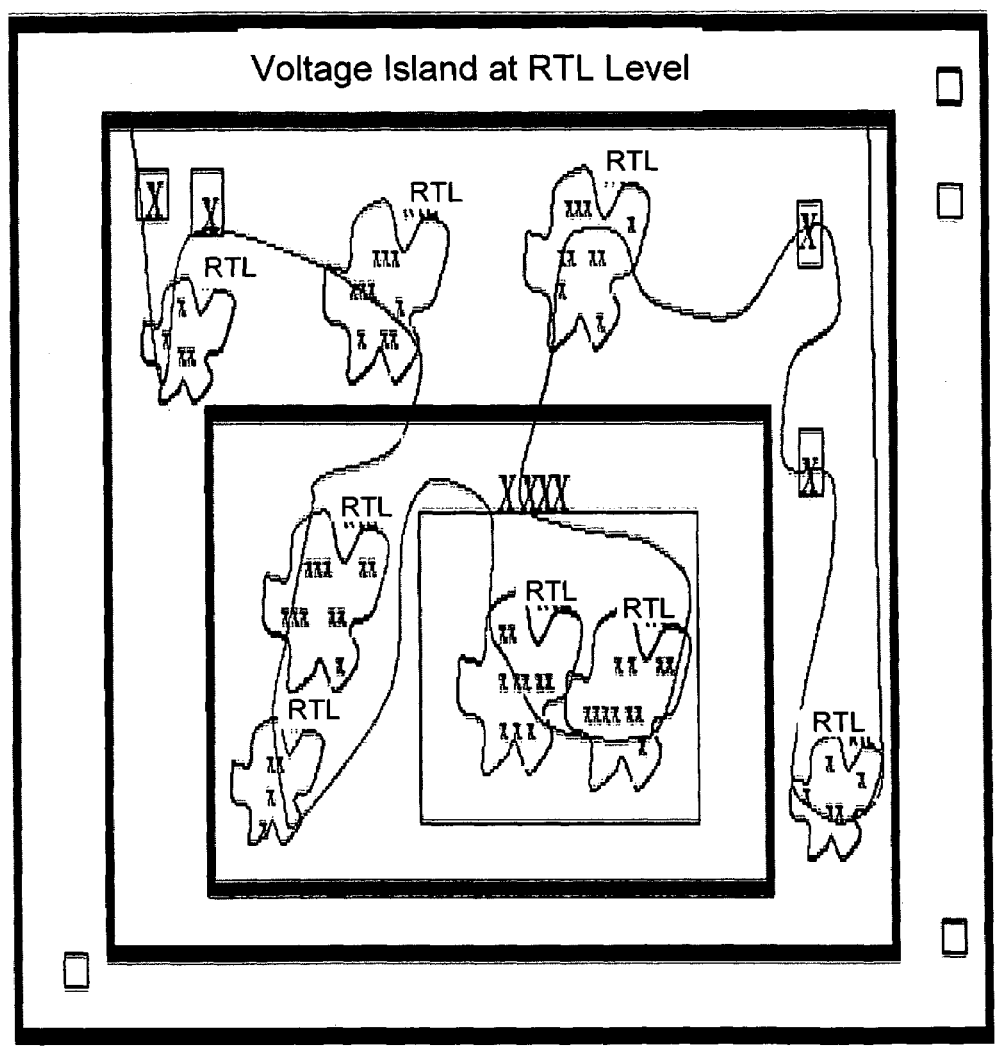
FIG. 3 illustrates voltage island (VI) switch objects incorporated into RTL design logic in accordance with the preferred embodiment.

FIG. 3 illustrates how an exemplary voltage island (VI) generally designated by the reference character 300 would place Xs labeled X on sequential RTL elements into RTL design logic in accordance with the preferred embodiment.

Figure 4:
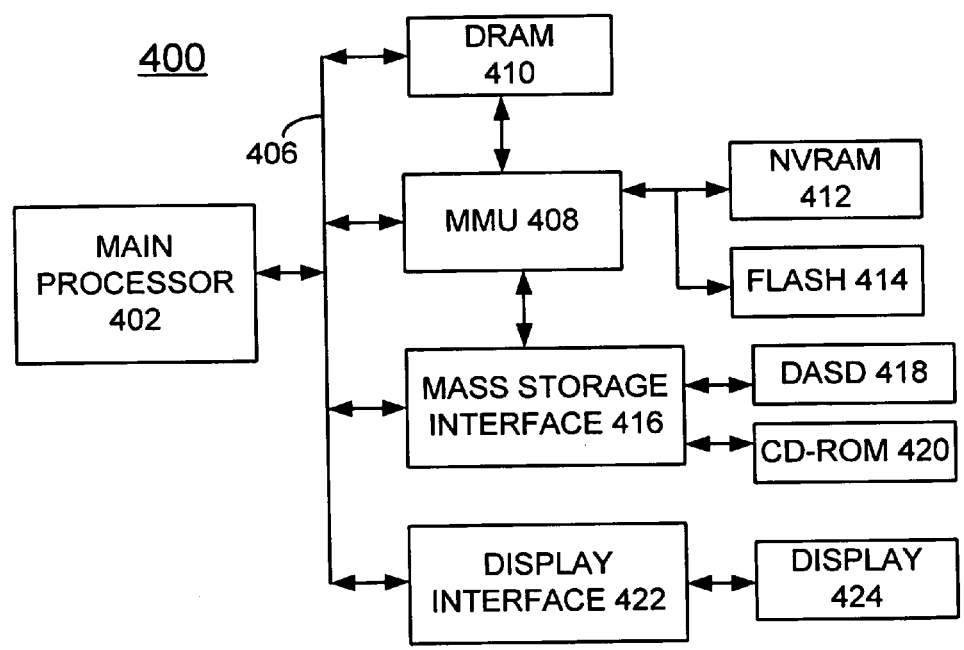
FIGS. 4 and 5 are block diagram representations illustrating a computer system and operating system for implementing RTL power sequencing simulation of voltage islands in application specific integrated circuit (ASIC) in accordance with the preferred embodiment.
Figure 5:
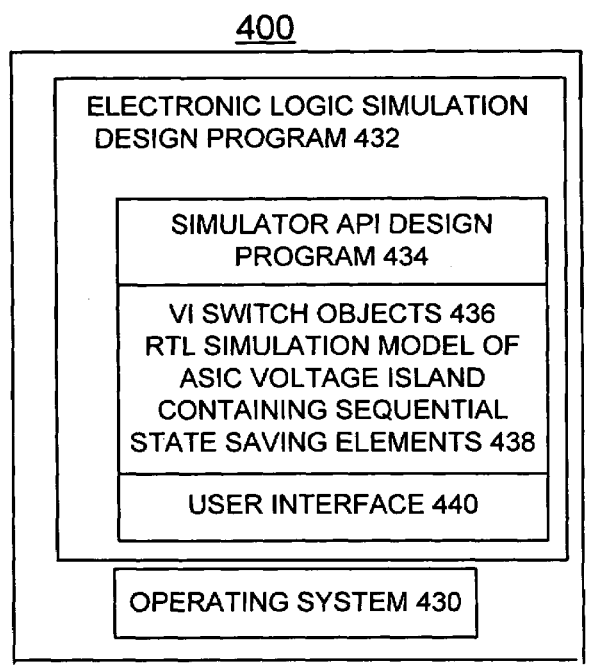

Referring now to the drawings, in FIGS. 4 and 5 there is shown a computer system generally designated by the reference character 400 for implementing RTL power sequencing simulation of voltage islands for ASIC designs in accordance with the preferred embodiment. Computer system 400 includes a main processor 402 or central processor unit (CPU) 402 coupled by a system bus 406 to a memory management unit (MMU) 408 and system memory including a dynamic random access memory (DRAM) 410, a nonvolatile random access memory (NVRAM) 412, and a flash memory 414. A mass storage interface 416 coupled to the system bus 406 and MMU 408 connects a direct access storage device (DASD) 418 and a CD-ROM drive 420 to the main processor 402. Computer system 400 includes a display interface 422 coupled to the system bus 406 and connected to a display 424.

Computer system 400 is shown in simplified form sufficient for understanding the present invention. The illustrated computer system 400 is not intended to imply architectural or functional limitations. The present invention can be used with various hardware implementations and systems and various other internal hardware devices, for example, multiple main processors.

As shown in FIG. 5, computer system 400 includes an operating system 430, an electronic logic simulation design program 432, a simulator API design program 434 of the preferred embodiment, enhanced RTL VI switch objects 436 and RTL simulation model of an ASIC with voltage islands containing sequential state saving elements 438 of the preferred embodiment and a user interface 440.

In accordance with features of the preferred embodiment, the user is enabled to specify RTL VI switch objects 436 and voltage islands 438 of a RTL design level for ASIC designs.

For Verilog HDL designs, sequential elements are identified by register and memory declarations in the source RTL design. These specific sequential RTL state saving elements 438 are detected and forced to invalid states by the VI switch objects 436 using the Verilog PLI.

For VHDL designs, sequential elements are identified by signals that are driven by complex or named processes. For VHDL not only must the signal be forced to 'X' but the driver for that signal must also be invalidated.

In both cases the VI switch objects 436 identify and skip potentially globally powered gate level circuits in the voltage island by special reserved signal identifiers in the ASIC library.

Figure 6:
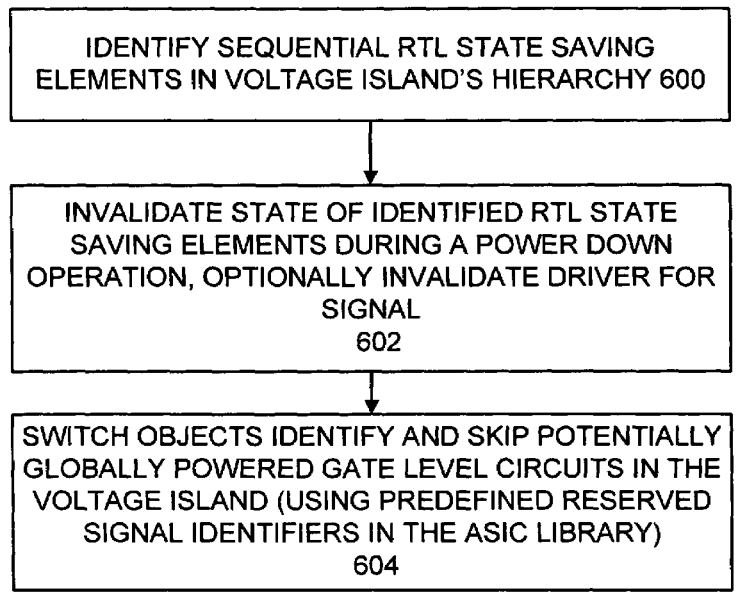
FIG. 6 is a flow chart illustrating exemplary steps for implementing RTL power sequencing simulation of voltage islands in application specific integrated circuit (ASIC) designs in accordance with the preferred embodiment.

Referring now to FIG. 6, there are shown exemplary steps for implementing RTL power sequencing simulation of voltage islands for ASIC designs in accordance with the preferred embodiment. Sequential RTL state saving elements in a voltage island's hierarchy are identified as indicated in a block 600. A state is invalidated for each identified RTL state saving element during a power down operation as indicated in a block 602 and optionally, for example, for VHDL designs, not only is the signal forced to 'X' the driver for the signal also is invalidated. The switch objects identify and skip potentially globally powered gate level circuits in the voltage island, for example, using predefined reserved signal identifiers in the ASIC library as indicated in a block 604.

In accordance with features of the invention, as part of the RTL voltage island simulation methodology the user will be able to access the voltage island switch object 436 via a special user signal and use that to simulate power down for objects outside of the scope of the RTL, for example, to connect with even higher level abstractions such as System C or other external models.

Figure 7:
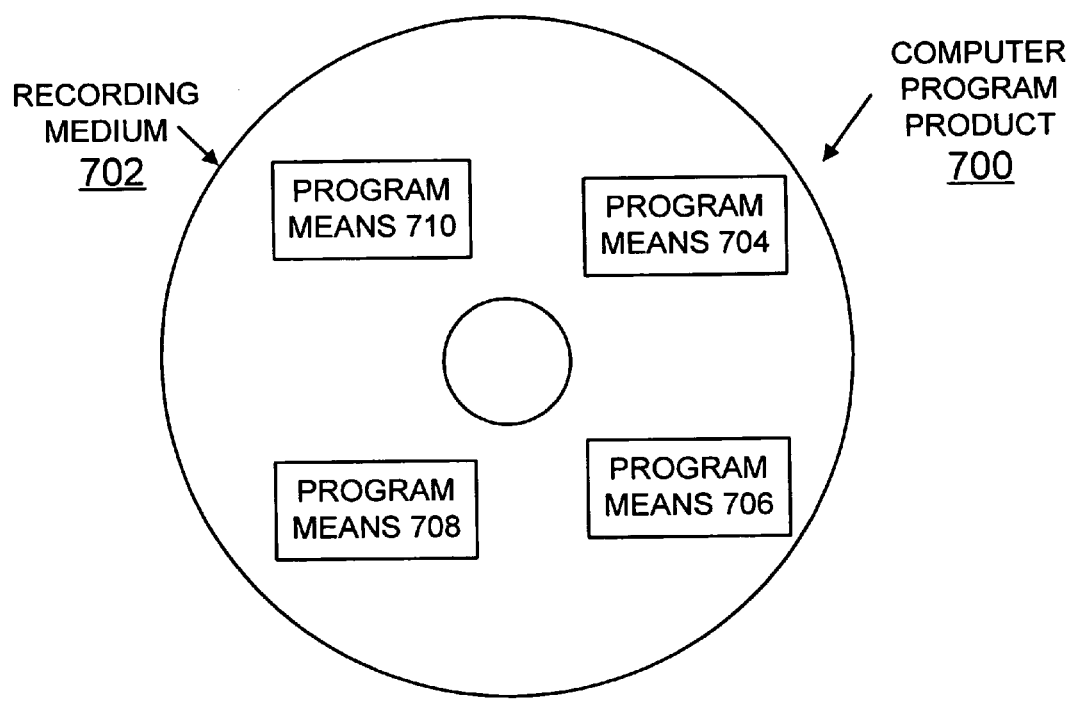
FIG. 7 is a block diagram illustrating a computer program product in accordance with the preferred embodiment.

Referring now to FIG. 7, an article of manufacture or a computer program product 700 of the invention is illustrated. The computer program product 700 includes a recording medium 702, such as, a floppy disk, a high capacity read only memory in the form of an optically read compact disk or CD-ROM, a tape, a transmission type media such as a digital or analog communications link, or a similar computer program product. Recording medium 702 stores program means 704, 706, 708, 710 on the medium 702 for carrying out the methods for implementing RTL power sequencing simulation of voltage islands for application specific integrated circuit (ASIC) designs of the preferred embodiment in the system 400 of FIG. 4.

A sequence of program instructions or a logical assembly of one or more interrelated modules defined by the recorded program means 704, 706, 708, 710, direct the computer system 400 for implementing RTL power sequencing simulation of voltage islands for application specific integrated circuit (ASIC) designs of the preferred embodiment.

While the present invention has been described with reference to the details of the embodiments of the invention shown in the drawing, these details are not intended to limit the scope of the invention as claimed in the appended claims.

What is claimed is:

1. A method for implementing RTL power sequencing simulation of voltage islands for application specific integrated circuit (ASIC) designs comprising the steps of:
   defining switch objects and voltage islands with RTL sequential state saving elements for an ASIC design;
   identifying said RTL sequential state saving elements in a voltage island hierarchy;
   invalidating a state for each identified RTL sequential state saving element during a power down operation; and
   using said switch objects to identify and skip globally powered gate level circuits in the voltage island hierarchy.

2. A method for implementing RTL power sequencing simulation of voltage islands as recited in claim 1 includes the step of using predefined reserved signal identifiers in an ASIC library to identify said switch objects and sequential RTL state saving elements.

3. A method for implementing RTL power sequencing simulation of voltage islands as recited in claim 1 includes the step of representing the ASIC design in a high level VHSIC Hardware Description Language (VHDL); and identifying said RTL sequential state saving elements for the ASIC design by signals driven by complex or named processes.

4. A method for implementing RTL power sequencing simulation of voltage islands as recited in claim 3 further includes the step of invalidating a driver for each of said signals.

5. A method for implementing RTL power sequencing simulation of voltage islands as recited in claim 1 includes the step of representing the ASIC design by a high level Verilog language and identifying said RTL sequential state saving elements for the ASIC design by register and memory declarations in a source RTL design.

6. A method for implementing RTL power sequencing simulation of voltage islands as recited in claim 5 includes the step of using a Verilog PLI for identifying said RTL sequential state saving elements in said voltage island hierarchy and for invalidating said state for each identified RTL state saving element during a power down operation.

7. A computer program product for implementing RTL power sequencing simulation of voltage islands for application specific integrated circuit (ASIC) designs in a computer system, said computer program product including instructions executed by the computer system to cause the computer system to perform the steps of:
   defining switch objects and voltage islands with RTL sequential state saving elements for an ASIC design;
   identifying said RTL sequential state saving elements in a voltage island hierarchy;
   invalidating a state for each identified RTL sequential state saving element during a power down operation; and
   using said switch objects to identify and skip globally powered gate level circuits in the voltage island hierarchy.

8. A computer program product for implementing RTL power sequencing simulation of voltage islands as recited in claim 7 includes the step of using predefined reserved signal identifiers in an ASIC library to identify said switch objects and RTL sequential state saving elements.

9. A computer program product for implementing RTL power sequencing simulation of voltage islands as recited in claim 7 includes the step of representing the ASIC design in a high level VHSIC Hardware Description Language (VHDL); and identifying said RTL sequential state saving elements for the ASIC design by signals driven by complex or named processes.

10. A computer program product for implementing RTL power sequencing simulation of voltage islands as recited in claim 9 further includes the steps of invalidating a driver for each of said signals.

11. A computer program product for implementing RTL power sequencing simulation of voltage islands as recited in claim 7 representing the ASIC design by a high level Verilog language and identifying said RTL sequential state saving elements for the ASIC design by register and memory declarations in a source RTL design.

12. A computer program product for implementing RTL power sequencing simulation of voltage islands as recited in claim 11 includes the step of using a Verilog PLI for identifying said RTL sequential state saving elements in said voltage island hierarchy and for invalidating said state for each identified RTL sequential state saving element during a power down operation.

13. Apparatus for implementing RTL power sequencing simulation of voltage islands for application specific integrated circuit (ASIC) designs comprising:
   a simulator program for defining switch objects and voltage islands with RTL sequential state saving elements for an ASIC design;
   said simulator program for identifying said RTL sequential state saving elements in a voltage island hierarchy; for invalidating a state for each identified RTL sequential state saving element during a power down operation; and for using said switch objects to identify and skip globally powered gate level circuits in the voltage island hierarchy.

14. Apparatus for implementing RTL power sequencing simulation of voltage islands as recited in claim 13 wherein said simulator program uses predefined reserved signal identifiers in an ASIC library to identify said switch objects and sequential RTL sequential state saving elements.

15. Apparatus for implementing RTL power sequencing simulation of voltage islands as recited in claim 13 wherein said simulator program represents the ASIC design in a high level VHSIC Hardware Description Language (VHDL); and identifies said RTL sequential state saving elements for the ASIC design by signals driven by complex or named processes.

16. Apparatus for implementing RTL power sequencing simulation of voltage islands as recited in claim 13 wherein said simulator program represents the ASIC design by a high level Verilog language and identifies said RTL sequential state saving elements for the ASIC design by register and memory declarations in a source RTL design.

* * * * *